(12) United States Patent
Uzawa et al.

(10) Patent No.: US 10,256,228 B2
(45) Date of Patent: Apr. 9, 2019

(54) SEMICONDUCTOR DEVICE

(71) Applicant: Renesas Electronics Corporation, Tokyo (JP)

(72) Inventors: Yoshihito Uzawa, Tokyo (JP); Yasuyuki Morishita, Tokyo (JP); Masanori Tanaka, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/858,242

(22) Filed: Dec. 29, 2017

(65) Prior Publication Data

US 2018/0211949 A1    Jul. 26, 2018

(30) Foreign Application Priority Data

Jan. 25, 2017  (JP) .................................. 2017-011250

(51) Int. Cl.
*H01L 27/02* (2006.01)
*H01L 27/06* (2006.01)

(52) U.S. Cl.
CPC ........ *H01L 27/027* (2013.01); *H01L 27/0255* (2013.01); *H01L 27/0277* (2013.01); *H01L 27/0288* (2013.01); *H01L 27/0629* (2013.01)

(58) Field of Classification Search
CPC combination set(s) only.
See application file for complete search history.

(56) References Cited

U.S. PATENT DOCUMENTS

| 6,154,082 A * | 11/2000 | Bernard ................. H02H 9/046 327/310 |
| 6,501,632 B1 | 12/2002 | Avery et al. |
| 2003/0133237 A1 | 7/2003 | Hung et al. |
| 2007/0058307 A1 * | 3/2007 | Mergens ............. H01L 27/0262 361/56 |
| 2009/0273867 A1 * | 11/2009 | Whitfield ............ H01L 27/0248 361/56 |
| 2010/0001347 A1 | 1/2010 | Sugiura |
| 2017/0366001 A1 * | 12/2017 | Cao .......................... H01L 25/16 |

FOREIGN PATENT DOCUMENTS

JP    2011-254100 A    12/2011
WO   WO 2007/145307 A1   12/2007

OTHER PUBLICATIONS

Extended European Search Report dated Jun. 1, 2018 in corresponding European Application No. 17209939.2.

* cited by examiner

*Primary Examiner* — Mamadou L Diallo
(74) *Attorney, Agent, or Firm* — McGinn I.P. Law Group, PLLC.

(57) ABSTRACT

A semiconductor device includes a MOS transistor which is coupled between two terminals and discharges current which flows caused by generation of static electricity and a diode which is coupled between a back gate of the MOS transistor and one of the terminal and has a polarity which is reversed to the polarity of a parasitic diode which is formed between the back gate and a source of the MOS transistor.

20 Claims, 19 Drawing Sheets

RELATION BETWEEN PARASITIC
DIODE OF NMOS TRANSISTOR
AND DIODE D1

DISCHARGE PATH IN CASE OF APPLICATION OF POSITIVE SURGE TO VDD USING GND AS COMMON TERMINAL

DISCHARGE PATH IN CASE OF APPLICATION OF POSITIVE SURGE TO GND USING VDD AS COMMON TERMINAL

ELEMENT SIZE IMAGE OF
MAIN ESD PROTECTION CIRCUIT
OF COMPARATIVE EXAMPLE

ELEMENT SIZE IMAGE OF
MAIN ESD PROTECTION CIRCUIT
OF FIRST EMBODIMENT

RELATION BETWEEN PARASITIC DIODE
OF NMOS (PMOS) TRANSISTOR
AND DIODE D2

DISCHARGE PATH IN CASE OF APPLICATION OF POSITIVE SURGE TO VDD USING GND AS COMMON TERMINAL

DISCHARGE PATH IN CASE OF APPLICATION OF
NEGATIVE SURGE TO GND USING VDD AS COMMON TERMINAL

SEMICONDUCTOR DEVICE

CROSS-REFERENCE TO RELATED APPLICATIONS

The disclosure of Japanese Patent Application No. 2017-011250 filed on Jan. 25, 2017 including the specification, drawings and abstract is incorporated herein by reference in its entirety.

BACKGROUND

The present invention relates to a semiconductor device and is relates to the semiconductor device which includes, for example, an electrostatic destruction protection circuit which protects elements formed in a semiconductor chip against electrostatic destruction.

In the semiconductor device, the electrostatic destruction protection circuit is incorporated for the purpose of protecting the elements which configure an internal circuit against the electrostatic destruction. One example of the electrostatic destruction protection circuit is disclosed in Japanese Unexamined Patent Application Publication No. 2011-254100.

The semiconductor device described in Japanese Unexamined Patent Application Publication No. 2011-254100 has first and second power source cells which correspond to first and second power source pads which supply first and second power source voltages, an input/output cell which corresponds to a first signal pad, a first power source line which supplies the first power source voltage and a second power source line which supplies the second power source voltage. Then, the input/output cell has a circuit which performs signal inputting and outputting, the electrostatic protection circuit and a first MOS which is arranged between the first power source line and the second power source line. The first power source cell has a time constant circuit which temporarily turns the first MOS on in response to positive static electricity of the first power source pad and a unidirectional element which makes a current directing toward the first power source pad flow. The second power source cell has a time constant circuit which temporarily turns the first MOS on in response to the positive static electricity of the second power source pad and a unidirectional element which makes a current directing toward the second power source pad flow. A gate and a well of the first MOS are coupled to the time constant circuits.

SUMMARY

However, the semiconductor device described in Japanese Unexamined Patent Application Publication No. 2011-254100 has such an issue that the element which serves as a discharge path varies depending on the static electricity application polarity and therefore the circuit area of the electrostatic destruction protection circuit is increased.

Other matters to be solved and novel features of the present invention will become apparent from description of the specification and the appended drawings.

According to one embodiment of the invention, there is provided a semiconductor device which includes a MOS transistor which is coupled between two terminals and discharges current which flows caused by generation of the static electricity and a diode which is coupled between a back gate of the MOS transistor and one of the terminals and has a polarity which is reverse to the polarity of a parasitic diode which is formed between the back gate and a source of the MOS transistor.

According to the semiconductor device according to the above-described one embodiment of the present invention, it is possible to reduce the circuit area of the electrostatic destruction protection circuit which protects circuit elements by discharging the current which flows caused by generation of the static electricity.

DETAILED DESCRIPTION

Details of the following description and drawings are appropriately omitted and simplified for clarification of explanation. Incidentally, in the respective drawings, the same symbols are assigned to the same elements and duplicated description thereof is omitted as necessary.

First Embodiment

Figure 1:
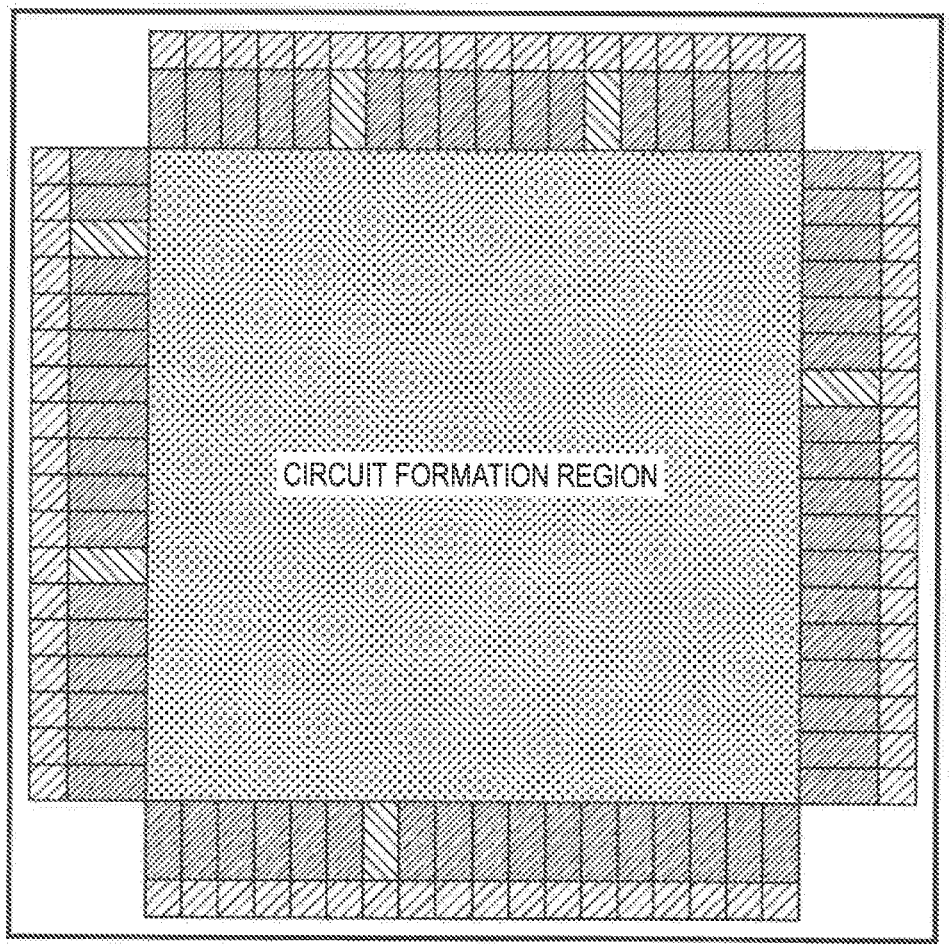
FIG. 1 is a diagram illustrating one example of a chip layout of a semiconductor device according to a first embodiment.

First, FIG. 1 is a diagram illustrating one example of a chip layout of a semiconductor device 1 according to the first embodiment. As illustrated in FIG. 1, in the semiconductor device 1 according to the first embodiment, pads are arranged along an outer periphery of a chip. Then, input/output interface circuits which correspond to the pads respectively are arrayed on the inner sides of the pads. Then, in the example illustrated in FIG. 1, a main electrostatic destruction protection circuit is arranged on part of each region in which the input/output interface circuits are arrayed. An internal circuit which achieves various functions of the semiconductor device 1 is arranged on the inner sides of the respective regions in which the input/output interface circuits are arrayed. Incidentally, the main electrostatic destruction protection circuits may be arranged in a region in which the internal circuit is arranged. The semiconductor device 1 according to the first embodiment has one of the features in a circuit configuration of the electrostatic destruction protection circuit.

Figure 2:
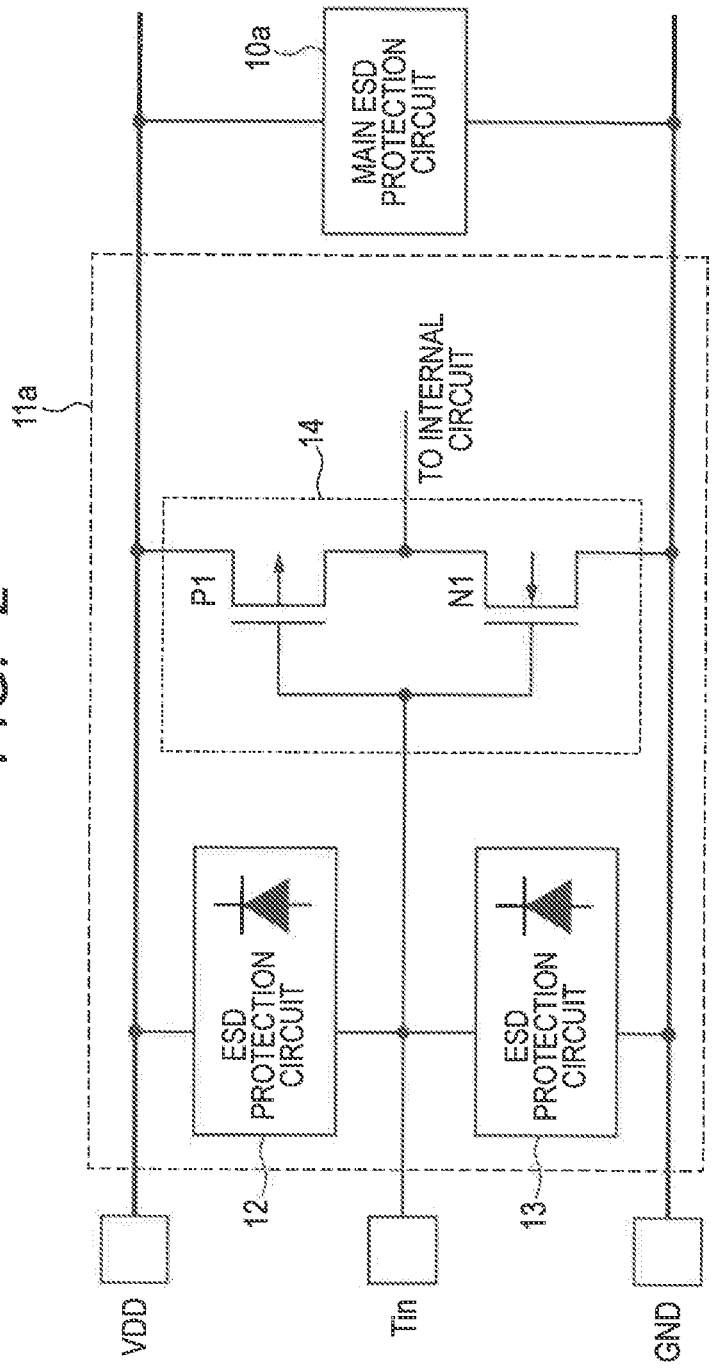
FIG. 2 is a block diagram illustrating one example of an electrostatic destruction protection circuit of the semiconductor device according to the first embodiment.

Then, FIG. 2 is a block diagram illustrating one example of the electrostatic destruction protection circuit of the semiconductor device 1 according to the first embodiment. In FIG. 2, a main electrostatic destruction protection circuit 10a and an input/output interface circuit 11a in the input/output interface circuits are illustrated. As illustrated in FIG. 2, the main electrostatic destruction protection circuit 10a is arranged between a power source terminal VDD and a grounding terminal GND. In addition, the input/output interface circuit 11a includes signal terminal electrostatic destruction protection circuits 12 and 13 in addition to an input buffer circuit 14.

The signal terminal electrostatic destruction protection circuit 12 is arranged between a signal input terminal Tin and the power source terminal VDD. The signal terminal electrostatic destruction protection circuit 12 is a diode in which, for example, an anode is coupled to the signal input terminal Tin and a cathode is coupled to the power source terminal VDD. The signal terminal electrostatic destruction protection circuit 13 is arranged between the grounding terminal GND and the signal input terminal Tin. The signal terminal electrostatic destruction protection circuit 13 is a diode in which, for example, an anode is coupled to the grounding terminal GND and a cathode is coupled to the signal input terminal Tin.

In addition, the input buffer circuit 14 is an inverter in which a PMOS transistor P1 and an NMOS transistor N1 are coupled in series with each other between the power source terminal VDD and the grounding terminal GND. A signal is given from the signal input terminal Tin to the inverter and an output terminal thereof is coupled to the internal circuit.

Figure 3:
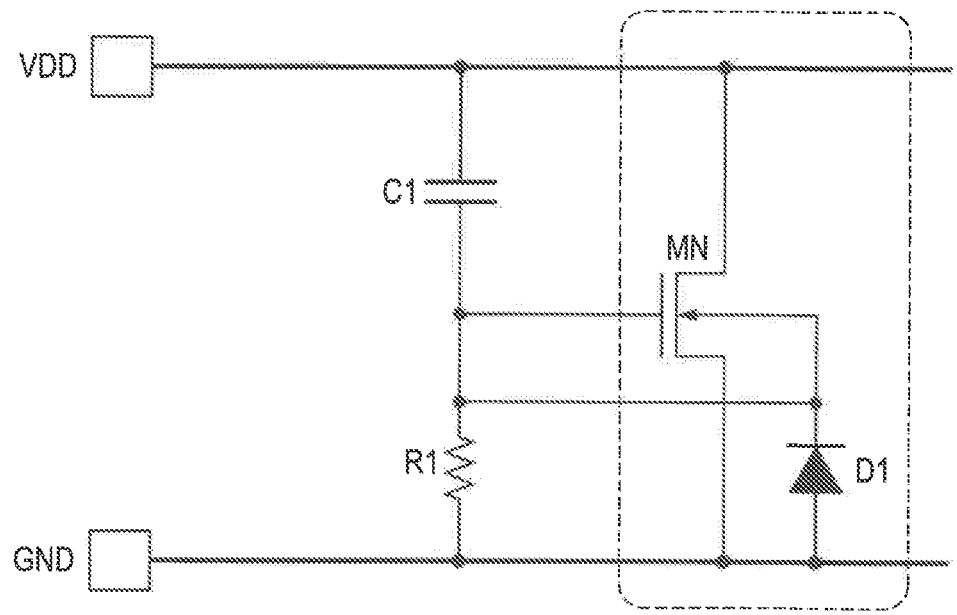
FIG. 3 is a circuit diagram illustrating one example of a main electrostatic destruction protection circuit of the semiconductor device according to the first embodiment.
Figure 3:
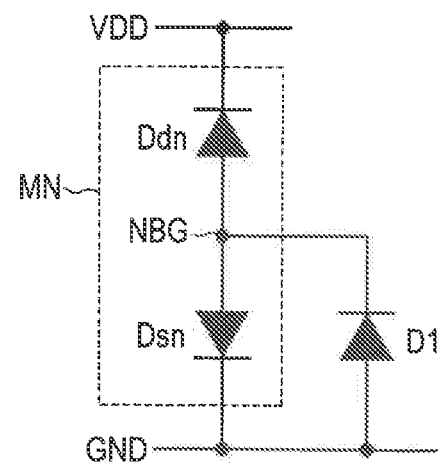

Here, the main electrostatic destruction protection circuit 10a will be described in detail. FIG. 3 is a circuit diagram illustrating one example of the main electrostatic destruction protection circuit 10a of the semiconductor device 1 according to the first embodiment. As illustrated in FIG. 3, the main electrostatic destruction protection circuit 10a includes a capacitor C1, a resistor R1, an electrostatic destruction protection transistor (for example, an NMOS protection transistor MN), a diode D1 and so forth. Incidentally, in FIG. 3, a diagram illustrating a relation in polarity between a parasitic diode which is formed in the NMOS protection transistor MN because of the structure of the NMOS protection transistor MN and the diode D1 is illustrated as reference. In addition, the main electrostatic destruction protection circuit 11a illustrated in FIG. 3 is of the type using an N-type conductivity-type MOS transistor (for example, the NMOS protection transistor MN) as an electrostatic destruction protection element.

A source of the NMOS protection transistor MN is coupled to a first terminal (for example, the grounding terminal GND) and a drain of the NMOS protection transistor MN is coupled to a second terminal (for example, the power source terminal VDD). The diode D1 is coupled between a back gate of the NMOS protection transistor MN and the first terminal (for example, the grounding terminal GND). Then, the diode D1 is arranged in such a manner that its polarity which occurs in a coupling direction is reversed to the polarity of a parasitic diode Dsn which is formed between the back gate and the source of the NMOS protection transistor MN. More specifically, in the main electrostatic destruction protection circuit 10a according to the first embodiment, the parasitic diode Dsn which uses a back-gate node NBG of the NMOS protection transistor MN as its anode and uses the source thereof as its cathode is formed in the NMOS protection transistor MN. Accordingly, in the main electrostatic destruction protection circuit 10a, the anode of the diode D1 is coupled to the grounding terminal GND and the cathode of the diode D1 is coupled to the back-gate node NBG of the NMOS protection transistor MN. Incidentally, a parasitic diode Ddn which uses the back-gate node NBG as its anode and uses the drain as its cathode is formed in the NMOS protection transistor MN.

In a case where an electrostatic surge of a positive polarity is applied to the power source terminal VDD or in a case where the electrostatic surge of a negative polarity is applied to the grounding terminal GND, the capacitor C1 and the resistor R1 configure an RC trigger circuit which controls the NMOS protection transistor MN to a conducting state. The resistor R1 is coupled to the first terminal (for example, the grounding terminal GND) at one end and is coupled the gate and the back gate of the NMOS protection transistor MN at the other end. In addition, the resistor R1 is coupled in parallel with the diode D1. The capacitor C1 is coupled to the gate of the NMOS protection transistor MN at one end and is coupled to the second terminal (for example, the power source terminal VDD) at the other end.

Figure 4:
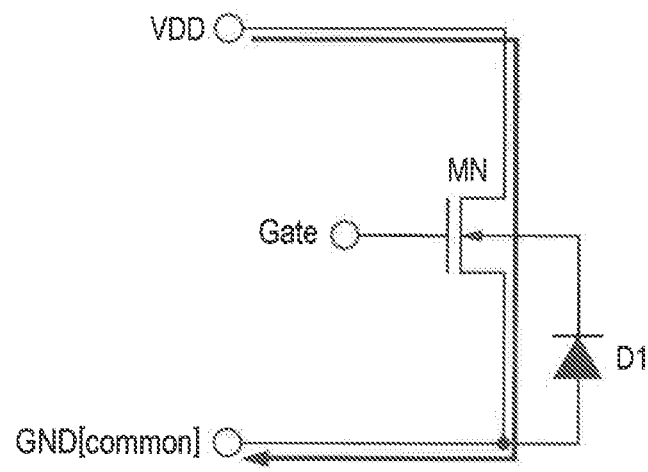
FIG. 4 is a diagram illustrating one example of a first operation of the main electrostatic destruction protection circuit of the semiconductor device according to the first embodiment.
Figure 4:
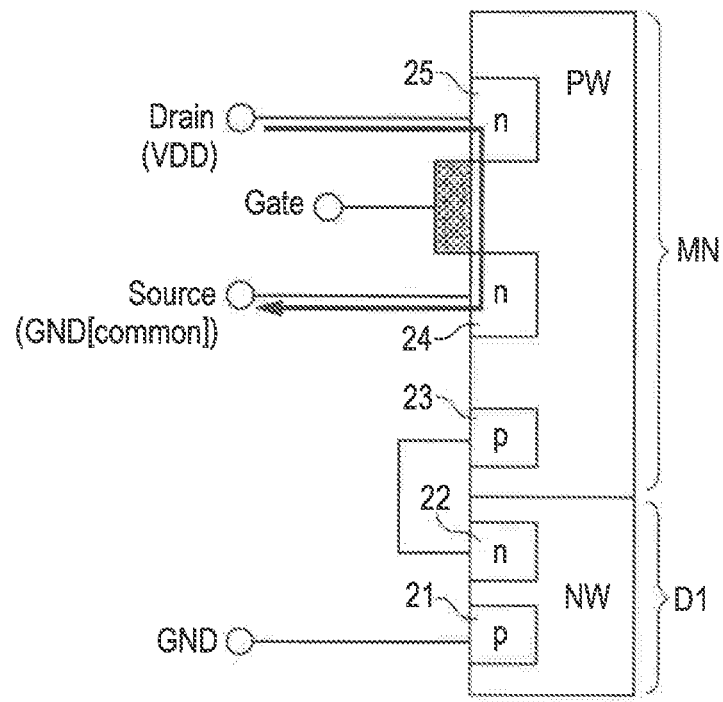

Then, operations of the main electrostatic destruction protection circuit 10a of the semiconductor device 1 according to the first embodiment will be described. Therefore, FIG. 4 is a diagram illustrating one example of a first operation of the main electrostatic destruction protection circuit 10a of the semiconductor device 1 according to the first embodiment. The first operation is an operation performed in a case where a positive surge (the surge in a direction that the current flows into the chip) is applied to the power source terminal VDD by using the grounding terminal GND as a common terminal. Incidentally, also in a case where a negative surge (the surge in a direction that the current is drawn out of the chip) is applied to the grounding terminal GND by using the power source terminal VDD as the common terminal, a discharge path which is the same as the discharge path formed in the first operation illustrated in FIG. 4 is formed.

Incidentally, in FIG. 4, an upper drawing illustrates one example of the discharge path with the NMOS protection transistor MN being illustrated as a transistor symbol and a lower drawing illustrates one example of the discharge path which is viewed in a direction of cross-sectional structures of the NMOS protection transistor MN and the diode D1.

As illustrated in the lower drawing of FIG. 4, in the NMOS protection transistor MN, N-type conductivity type source diffusion region 24 and drain diffusion region 25 are formed in a surface layer of a P-type well region PW. In addition, the gate is formed in an upper layer of a semiconductor substrate in a state of striding over the source diffusion region 24 and the drain diffusion region 25. In addition, in the NMOS protection transistor MN, a P-type contact region 23 which applies a potential to the p-type well region PW which serves as the back gate is formed in the surface layer of the P-type well region PW. In the diode D1, a P-type diffusion region 21 which serves as an anode terminal and an N-type diffusion region 22 which serves as a cathode terminal are formed in a surface layer of an N-type well region NW.

As illustrated in FIG. 4, in the first operation, when the surge is applied, a gate voltage of the NMOS protection transistor MN is increased. Therefore, the NMOS protection transistor MN is brought into the conducting state and a surge current is discharged from the power source terminal VDD toward the grounding terminal GND owing to the operation of the NMOS protection transistor MN as a MOS transistor.

Figure 5:
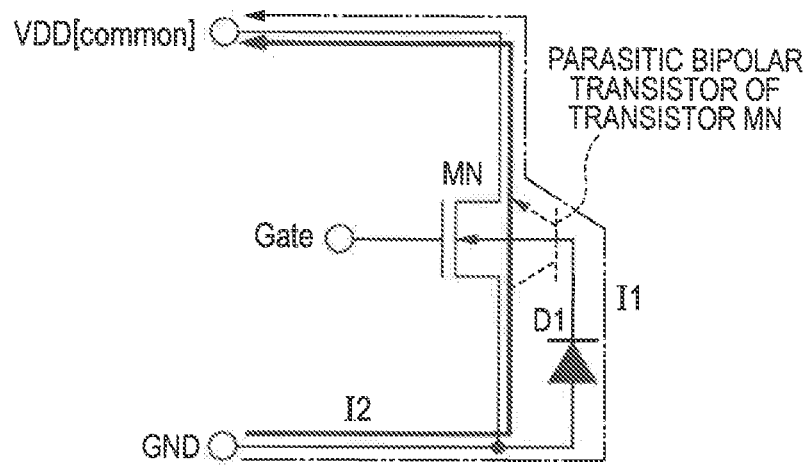
FIG. 5 is a diagram illustrating one example of a second operation of the main electrostatic destruction protection circuit of the semiconductor device according to the first embodiment.
Figure 5:
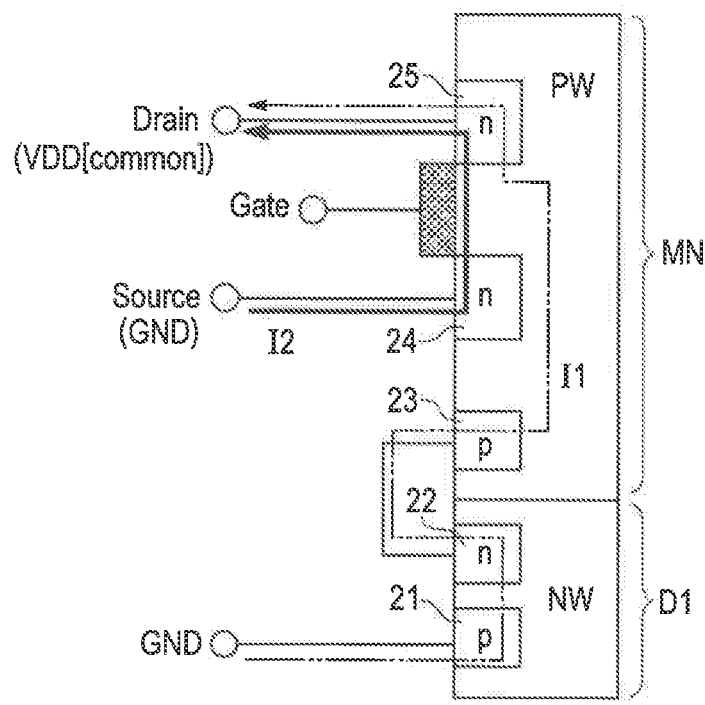

Then, FIG. 5 is a diagram illustrating one example of a second operation of the main electrostatic destruction protection circuit 10a of the semiconductor device 1 according to the first embodiment. The second operation is an operation performed in a case where the positive surge is applied to the grounding terminal GND by using the power source terminal VDD as the common terminal. Incidentally, also in a case where the negative surge is applied to the power source terminal VDD by using the grounding terminal GND as the common terminal, the discharge path which is the same as the discharge path formed in the second operation illustrated in FIG. 5 is formed.

Incidentally, also in FIG. 5, an upper drawing illustrates one example of the discharge path with the NMOS protection transistor MN being illustrated as the transistor symbol and a lower drawing illustrates one example of the discharge path which is viewed in the direction of the cross-sectional structures of the NMOS protection transistor MN and the diode D1.

As illustrated in FIG. 5, in the second operation, when the surge is applied, part (a current I1 in FIG. 5) of a surge current (I2 in FIG. 5) flows into the back gate of the NMOS protection transistor via the diode D1. Thereby, a parasitic bipolar transistor which uses the back gate of the NMOS protection transistor MN as its base, uses a source thereof as its collector and uses a drain thereof as its emitter is operated. Accordingly, in the second operation, the surge current I2 is discharged from the grounding terminal GND toward the power source terminal VDD owing to the operation of the parasitic bipolar transistor.

As described by using FIG. 5, in the semiconductor device 1 according to the first embodiment, also in a case where the surge is applied to the grounding terminal GND by using the power source terminal VDD as the common terminal in a state where the NMOS protection transistor MN is not operated as the MOS transistor, most of the surge current is discharged via the NMOS protection transistor MN. Thereby, in the main electrostatic destruction protection circuit 10a of the semiconductor device 1 according to the first embodiment, it is possible to reduce a current capacity requested to the diode D1. That is, in the semiconductor device 1 according to the first embodiment, it is possible to miniaturize the diode D1. Therefore, examples of a layout of the NMOS protection transistor MN and the diode D1 in the semiconductor device 1 according to the first embodiment will be described in the following.

Figure 6:
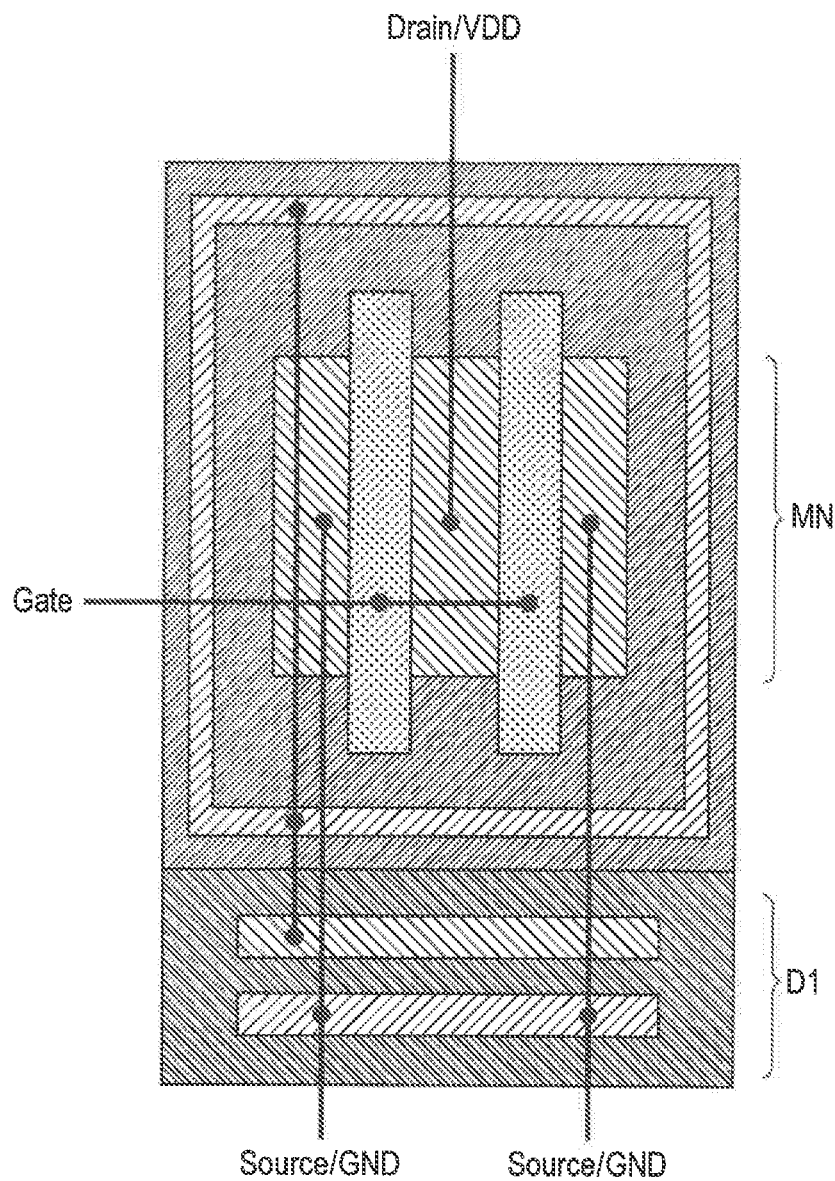
FIG. 6 is a diagram illustrating a first example of a layout of the main electrostatic destruction protection circuit of the semiconductor device according to the first embodiment.

FIG. 6 is a diagram illustrating a first example of the layout of the main electrostatic destruction protection circuit (the NMOS protection transistor MN and the diode D1) of the semiconductor device 1 according to the first embodiment. As illustrated in FIG. 6, in the NMOS protection transistor MN of the semiconductor device 1 according to the first embodiment, a plurality of polysilicon (polycrystalline silicon) elements which serve as gate terminals are arranged in an upper layer of the P-type well region. In addition, the N-type diffusion region is formed in a state of striding over the polysilicon elements. The N-type diffusion region serves as the source and then as the drain of the NMOS protection transistor NM in turn. In addition, the P-type diffusion region which serves as a contact region to the back gate of the NMOS protection transistor MN is formed to surround the respective regions which serve as the gate, the source and the drain of the NMOS protection transistor MN.

In the diode D1, the P-type diffusion region which serves as the anode terminal of the diode D1 and the N-type diffusion region which serves as the cathode terminal thereof are formed in the surface layer of the N-type well region.

Basic configurations of the NMOS protection transistor MN and the diode D1 which are described above are common among a second example to a fourth example of the layout of the NMOS protection transistor MN and the diode D1 of the semiconductor device 1 according to the first embodiment which will be described later.

Then, in the first example of the layout illustrated in FIG. 6, the diode D1 is formed in one of regions which are arranged adjacent to the NMOS protection transistor MN.

Figure 7:
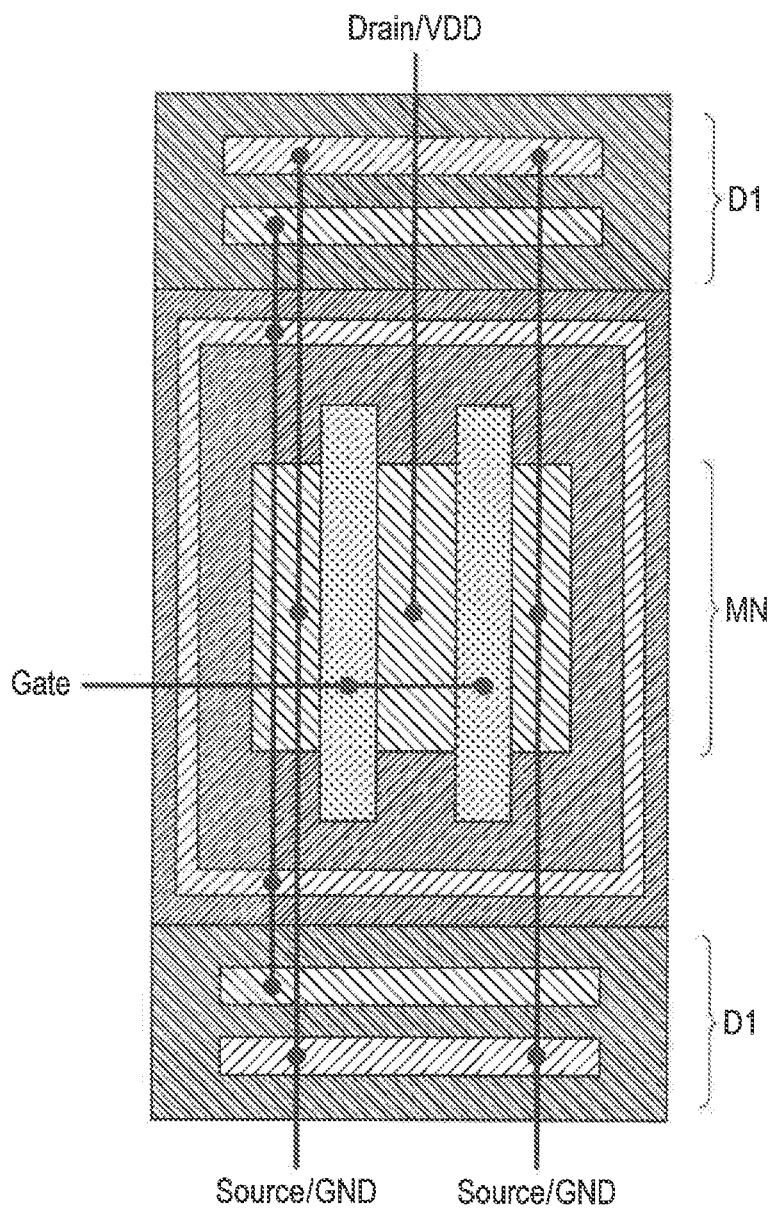
FIG. 7 is a diagram illustrating a second example of the layout of the main electrostatic destruction protection circuit of the semiconductor device according to the first embodiment.
Figure 7:
Figure 8:
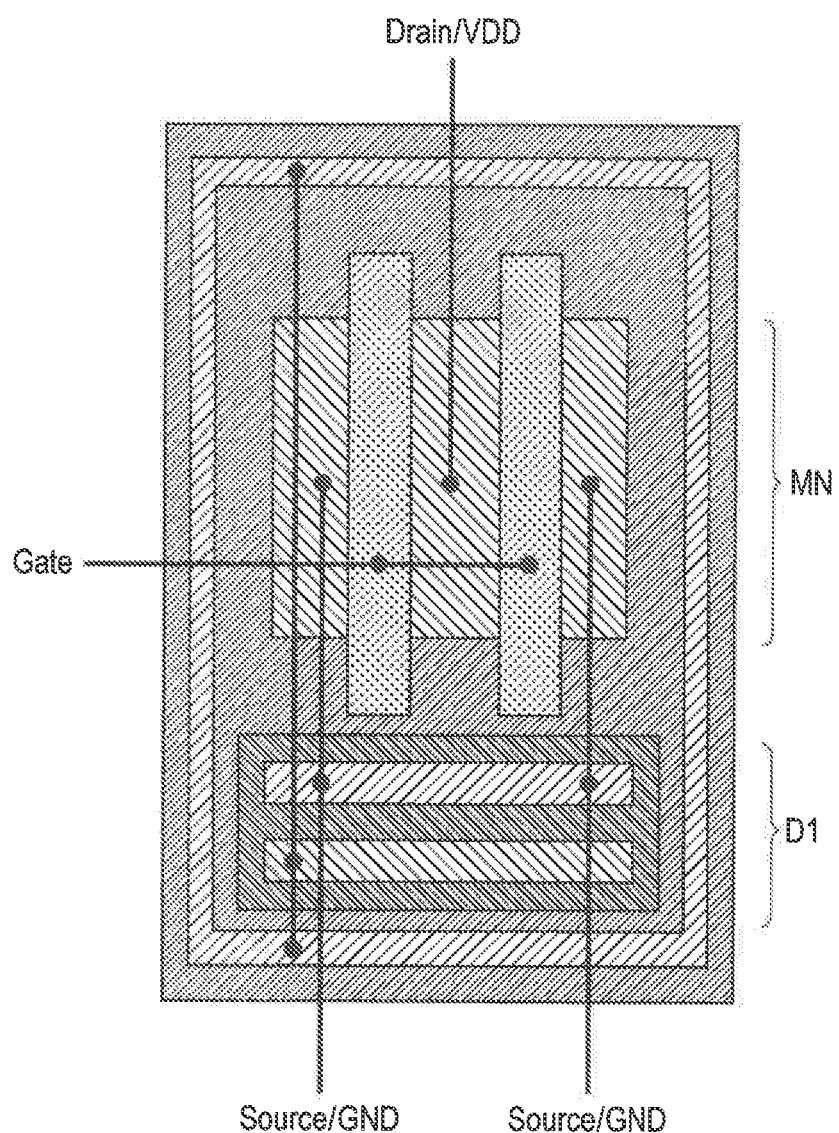
FIG. 8 is a diagram illustrating a third example of the layout of the main electrostatic destruction protection circuit of the semiconductor device according to the first embodiment.
Figure 8:
Figure 9:
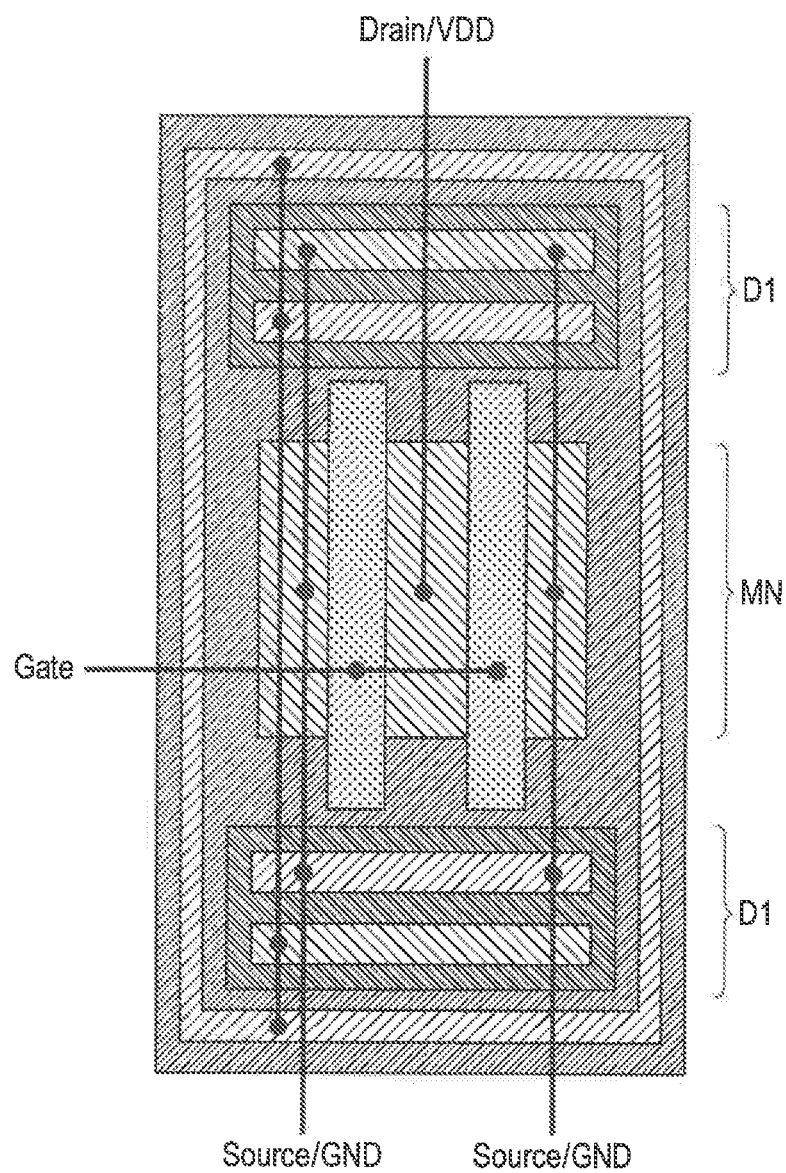
FIG. 9 is a diagram illustrating a fourth example of the layout of the main electrostatic destruction protection circuit of the semiconductor device according to the first embodiment.
Figure 9:

Then, FIG. 7 to FIG. 9 are diagrams illustrating the second example to the fourth example of the layout of the main electrostatic destruction protection circuit of the semiconductor device 1 according to the first embodiment respectively. In the second example illustrated in FIG. 7, the diode D1 is formed in a state of being divided into parts between which a region in which the NMOS protection transistor MN is formed is sandwiched. In the third example illustrated in FIG. 8, the diode D1 is formed in part of a region arranged on the inner side of the P-type diffusion region which serves as the contact region of the NMOS protection transistor MN. In the fourth example illustrated in FIG. 9, the diode D1 is formed in a state of being divided into a plurality of regions (two regions in the example in FIG. 9) which are arranged on the inner side of the P-type diffusion region which serves as the contact region of the NMOS protection transistor MN.

Figure 10:
FIG. 10 is a diagram illustrating one example of the layout area of the main electrostatic destruction protection circuit of the semiconductor device according to the first embodiment.
Figure 10:
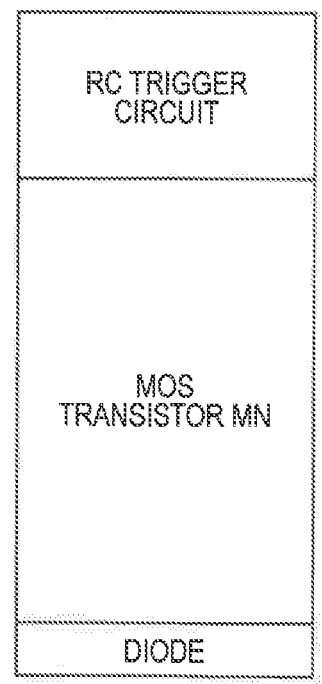

Then, the layout area of the main electrostatic destruction protection circuit 10a of the semiconductor device 1 according to the first embodiment will be described. Therefore, FIG. 10 is a diagram illustrating one example of the layout area of the main electrostatic destruction protection circuit of the semiconductor device 1 according to the first embodiment. Incidentally, in FIG. 10, the layout area in a case where the diode is used as the path through which most of the surge current is discharged as disclosed, for example, in Japanese Unexamined Patent Application Publication No. 2011-254100 is illustrated as a comparative example.

In the semiconductor device 1 according to the first embodiment, it is possible to reduce the current capacity of the diode D1 to an extent which is sufficient to make a base current of the parasitic bipolar transistor formed in the NMOS protection transistor MN flow. Therefore, as illustrated in FIG. 10, in the semiconductor device 1 according to the first embodiment, it is possible to make the area which is necessary for formation of the diode D1 of the main electrostatic destruction protection circuit 10a greatly smaller than the area in the semiconductor device in the comparative example.

As described above, in the semiconductor device 1 according to the first embodiment, in a case where it is not possible to discharge the surge current because the MNOS protection transistor MN does not operate as the MOS transistor, the base current of the parasitic bipolar transistor of the NMOS protection transistor MN is supplied by the diode D1. Then, the semiconductor device 1 according to the first embodiment discharges the surge current owing to the operation of the parasitic bipolar transistor of the NMOS protection transistor MN. Thereby, the semiconductor device 1 according to the first embodiment is able to reduce the current capacity requested to the diode D1 and to reduce the layout area of the diode D1.

In addition, it is possible to increase the number of the input/output interface circuits which are allowed to be arrayed on one side of the semiconductor chip by reducing the layout area of the main electrostatic destruction protection circuit 10a. Alternatively, it is also possible to shorten the length of one side of the semiconductor chip and to reduce the chip area while arranging the necessary number of the input/output interface circuits by reducing the layout area of the main electrostatic destruction protection circuit 10a.

Incidentally, a modified example of the main electrostatic destruction protection circuit 10a of the semiconductor device 1 according to the first embodiment is conceivable. Accordingly, FIG. 11 is a circuit diagram illustrating another example (for example, a main electrostatic destruction protection circuit 10b) of the main electrostatic destruction protection circuit 10a of the semiconductor device 1 according to the first embodiment.

Figure 11:
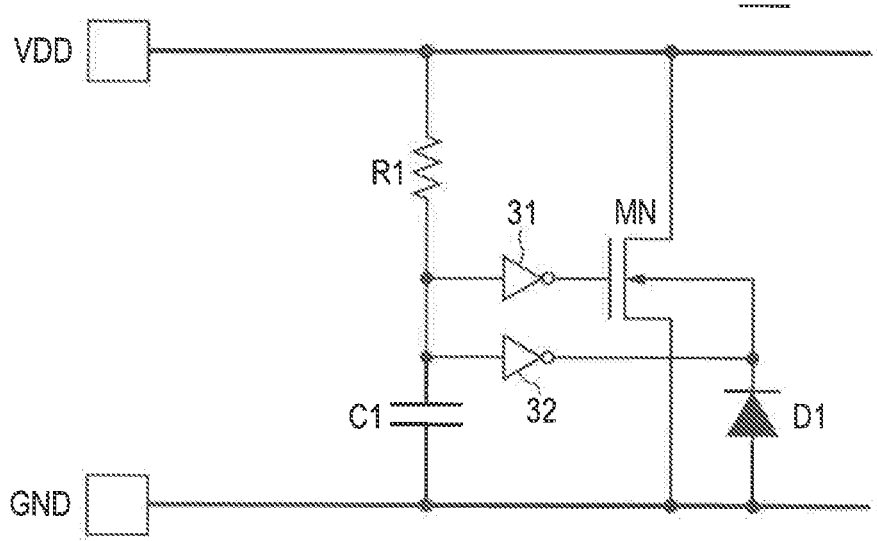
FIG. 11 is a circuit diagram illustrating another example of the main electrostatic destruction protection circuit of the semiconductor device according to the first embodiment.

As illustrated in FIG. 11, in the main electrostatic destruction protection circuit 10b, one end of the capacitor C1 is coupled to the first terminal (for example, the grounding terminal GND). In addition, the resistor R1 is coupled to the second terminal (for example, the power source terminal VDD) at one end and is coupled to the other end of the capacitor C1 at the other end. Then, a first inverter (for example, an inverter 31) is arranged between wiring which couples together the capacitor C1 and the resistor R1 and the gate of the NMOS protection transistor MN. An input terminal of the inverter 31 is coupled to the wiring which couples together the capacitor C1 and the resistor R1 and an output terminal of the inverter 31 is coupled to the gate of the NMOS protection transistor MN. In addition, a second inverter (for example, an inverter 32) is arranged between the wiring which couples together the capacitor C1 and the resistor R1 and the back gate of the NMOS protection transistor MN. An input terminal of the inverter 32 is coupled to the wiring which couples together the capacitor C1 and the resistor R1 and an output terminal of the inverter 32 is coupled to the back gate of the NMOS protection transistor MN.

Incidentally, the inverters 31 and 32 are supplied with power from the power source terminal VDD and the grounding terminal GND. In addition, the inverters 31 and 32 are not used as a main path for discharging the surge current and therefore element sizes of transistors which configure the inverters 31 and 32 may be made small.

In a case where the size of the diode D1 is small, it is possible to sufficiently reduce the layout area irrespective of inclusion of other circuits between the RC trigger circuit and the gate or the back gate of the NMOS protection transistor MN as in the main electrostatic destruction protection circuit 10b.

In addition, the cross-sectional structures of the NMOS protection transistor MN and the diode D1 may be modified into structures other than those in the examples illustrated in FIG. 4 and/or FIG. 5. Therefore, FIG. 12 is a sectional diagram of the semiconductor chip, illustrating another example of the structures of the NMOS protection transistor MN and the diode D1 of the main electrostatic destruction protection circuit of the semiconductor device 1 according to the first embodiment.

Figure 12:
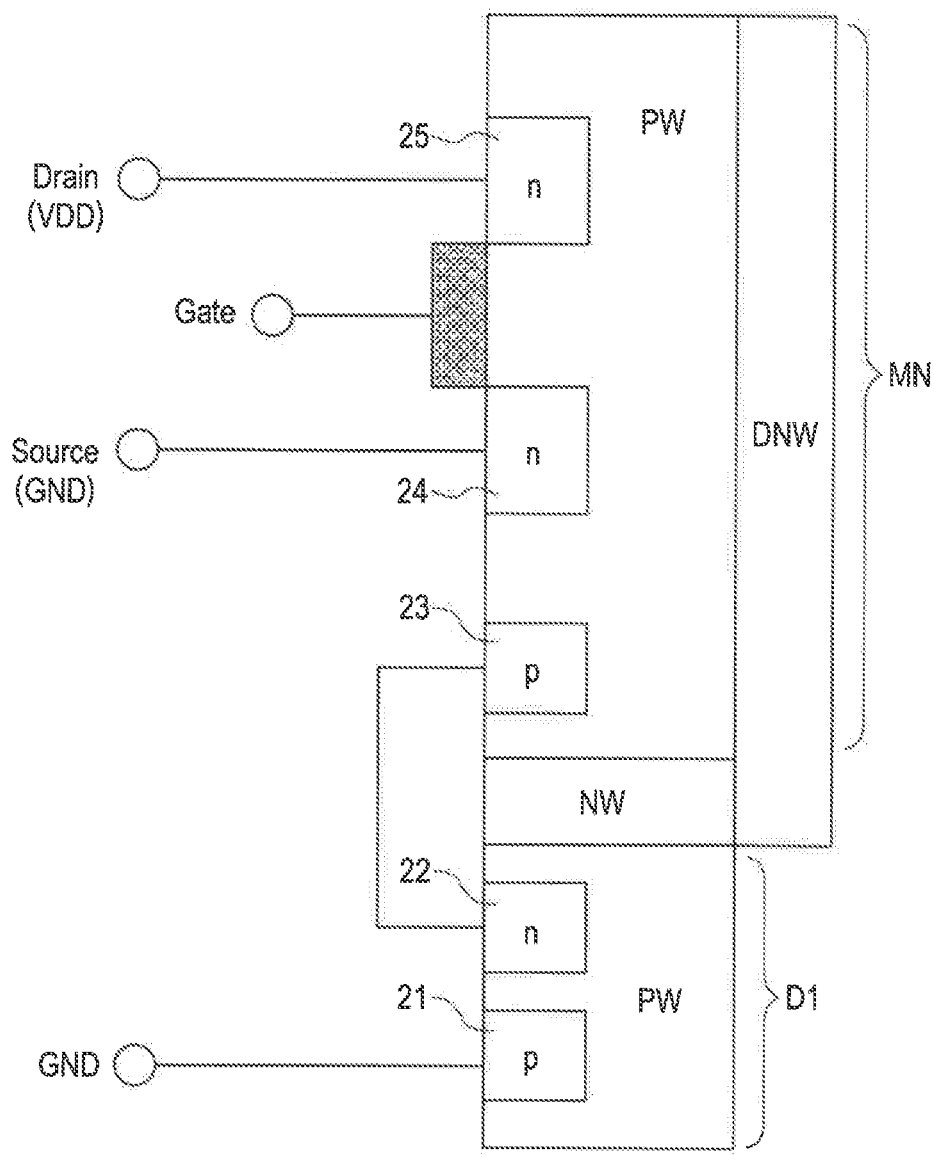
FIG. 12 is a sectional diagram of a semiconductor chip, illustrating another example of structures of a MOS transistor and a diode of the main electrostatic destruction protection circuit of the semiconductor device according to the first embodiment.

In the example illustrated in FIG. 12, the P-type well region PW of the NMOS protection transistor MN is surrounded by a deep N-type well region DNW and an N-type well region NW and the diode D1 is formed on the P-type well region PW. Element isolation of the NMOS protection transistor MN from the diode D1 is also possible by modifying the cross-sectional structures of the NMOS protection transistor MN and the diode D1 in this way.

Second Embodiment

Figure 13:
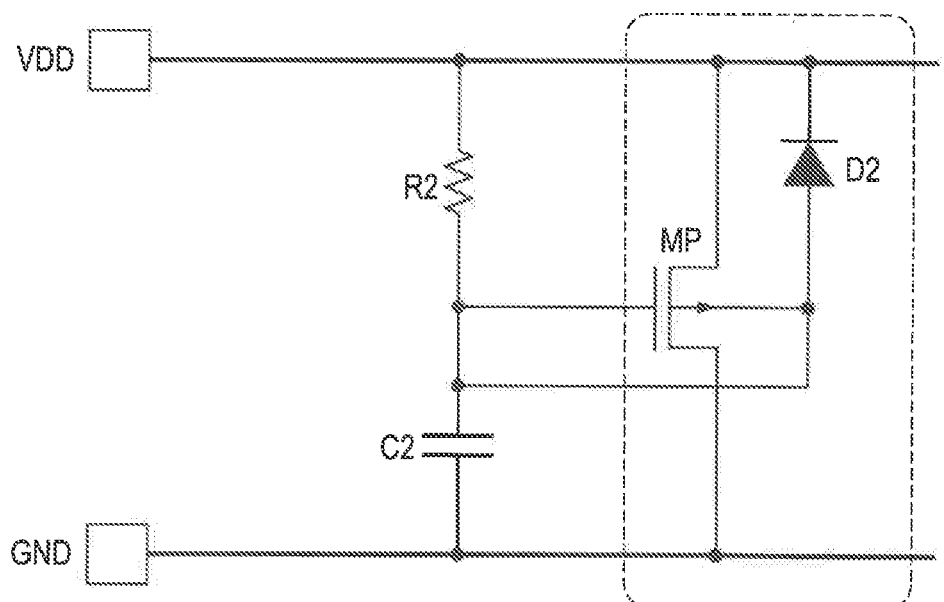
FIG. 13 is a circuit diagram illustrating one example of a main electrostatic destruction protection circuit of a semiconductor device according to a second embodiment.
Figure 13:
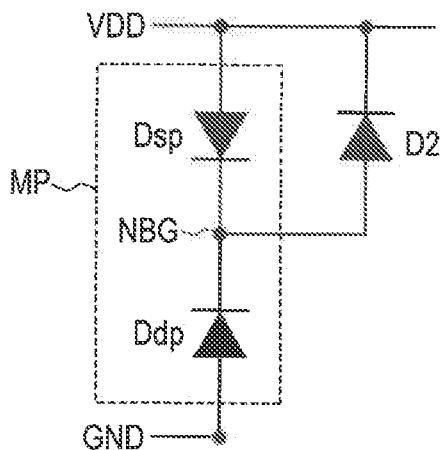

In the second embodiment, an example that the NMOS protection transistor MN is replaced with a P-type MOS transistor (for example, a PMOS protection transistor MP) will be described. Therefore, FIG. 13 is a circuit diagram illustrating one example of a main electrostatic destruction protection circuit 10c of a semiconductor device according to the second embodiment. As illustrated in FIG. 13, the main electrostatic destruction protection circuit 10c includes a capacitor C2, a resistor R2, the PMOS protection transistor MP, a diode D2 and so forth. Incidentally, in FIG. 13, a diagram illustrating a relation in polarity between a parasitic diode which is formed in the PMOS protection transistor MP because of the structure of the PMOS protection transistor MP and the diode D2 is illustrated as reference. In addition, the main electrostatic destruction protection circuit 11c illustrated in FIG. 13 is of the type using a P-type conductivity-type MOS transistor (for example, the PMOS protection transistor MP) as the electrostatic destruction protection element.

A source of the PMOS protection transistor MP is coupled to the first terminal (for example, the power source terminal VDD) and a drain of the PMOS protection transistor MP is coupled to the second terminal (for example, the grounding terminal GND). The diode D2 is coupled between a back gate of the PMOS protection transistor MP and the first terminal (for example, the power source terminal VDD). Then, the diode D2 is arranged in such a manner that its polarity occurring in the coupling direction is reversed to a polarity of a parasitic diode Dsp which is formed between the back gate and the source of the PMOS protection transistor MP. More specifically, in the main electrostatic destruction protection circuit 10c of the semiconductor device according to the second embodiment, the parasitic diode Dsp which uses the back-gate node NBG of the PMOS protection transistor MP as its cathode and uses the source thereof as its anode is formed in the PMOS protection transistor MP. Accordingly, in the main electrostatic destruction protection circuit 10c, the anode of the diode D2 is coupled to the back-gate node NBG of the PMOS protection transistor MP and the cathode of the diode D2 is coupled to the power source terminal VDD. Incidentally, a parasitic diode Ddp which uses the back-gate node NBG of the PMOS protection transistor MP as its cathode and uses the drain thereof as its anode is formed in the PMOS protection transistor MP.

In a case where the electrostatic surge of the positive polarity is applied to the power source terminal VDD or in a case where the electrostatic surge of the negative polarity is applied to the grounding terminal GND, the capacitor C2 and the resistor R2 configure the RC trigger circuit which controls the PMOS protection transistor MP to the conducting state. The resistor R2 is coupled to the first terminal (for example, the power source terminal VDD) at one end and is coupled the gate and the back gate of the PMOS protection transistor MP at the other end. In addition, the resistor R2 is coupled in parallel with the diode D2. The capacitor C2 is coupled to the gate of the PMOS protection transistor MP at one end and is coupled to the second terminal (for example, the grounding terminal GND) at the other end.

Figure 14:
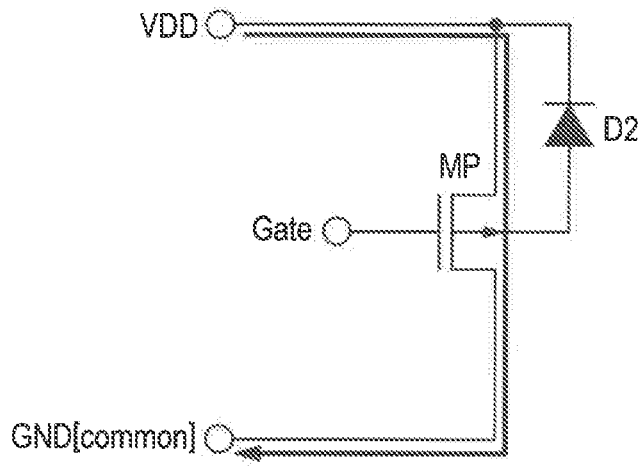
FIG. 14 is a diagram illustrating one example of the first operation of the main electrostatic destruction protection circuit of the semiconductor device according to the second embodiment.
Figure 14:
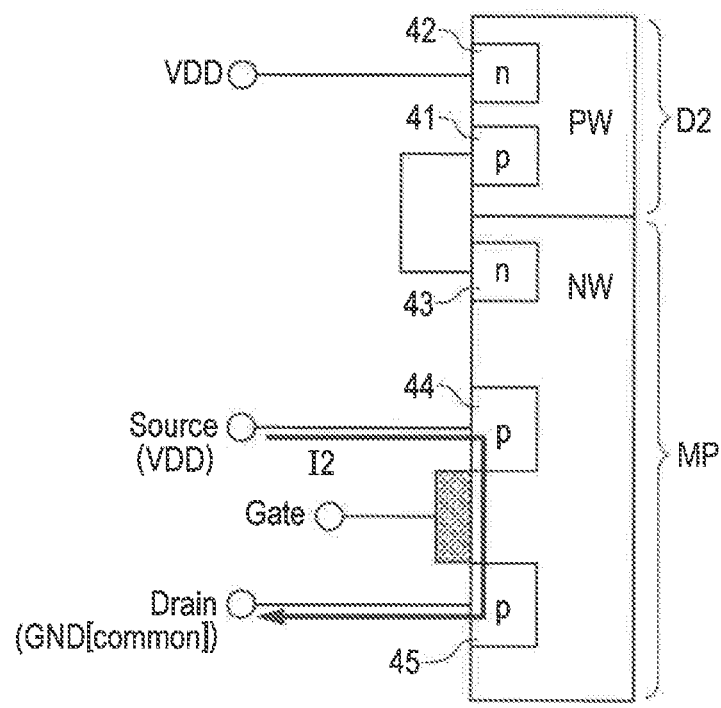

Then, operations of the main electrostatic destruction protection circuit 10c of the semiconductor device according to the second embodiment will be described. Therefore, FIG. 14 is a diagram illustrating one example of the first operation of the main electrostatic destruction protection circuit 10c of the semiconductor device according to the second embodiment. The first operation is the operation performed in a case where the positive surge is applied to the power source terminal VDD by using the grounding terminal GND as the common terminal. Incidentally, also in a case where the negative surge is applied to the grounding terminal GND by using the power source terminal VDD as the common terminal, the discharge path which is the same as the discharge path formed in the first operation illustrated in FIG. 14 is formed.

Incidentally, in FIG. 14, an upper drawing illustrates one example of the discharge path with the PMOS protection transistor MP being illustrated as the transistor symbol and a lower drawing illustrates one example of the discharge path which is viewed in the direction of the cross-sectional structures of the PMOS protection transistor MP and the diode D2.

As illustrated in the lower drawing of FIG. 14, in the PMOS protection transistor MP, P-type conductivity type source diffusion region 44 and drain diffusion region 45 are formed in a surface layer of an N-type well region NW. In addition, the gate is formed in an upper layer of a semiconductor substrate in a state of striding over the source diffusion region 44 and the drain diffusion region 45. In addition, in the PMOS protection transistor PN, an N-type contact region 43 which applies the potential to the N-type well region NW which serves as the back gate is formed in the surface layer of the N-type well region NW. In the diode D2, a P-type diffusion region 41 which serves as an anode terminal and an N-type diffusion region 42 which serves as a cathode terminal are formed in the surface layer of the P-type well region PW.

As illustrated in FIG. 14, in the first operation, when the surge is applied, a gate voltage of the PMOS protection transistor MP becomes lower than a source voltage thereof. Therefore, the PNMOS protection transistor MP is brought into the conducting state and the surge current is discharged from the power source terminal VDD toward the grounding terminal GND owing to the operation of the PMOS protection transistor MP as the MOS transistor.

Figure 15:
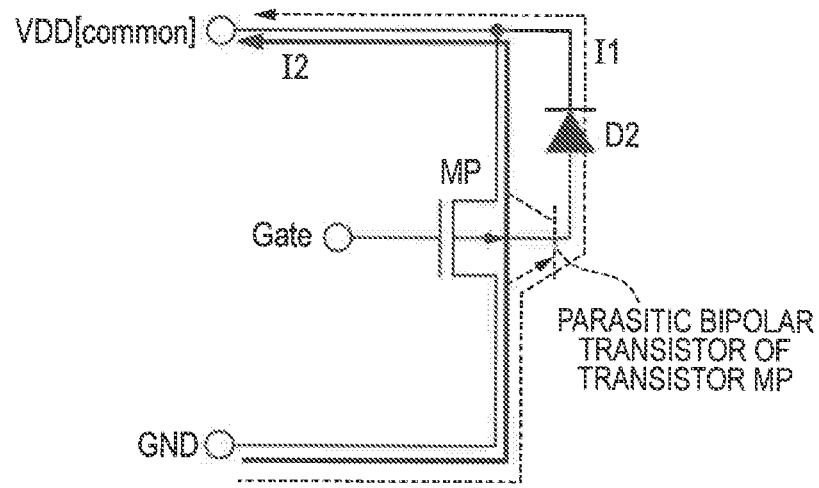
FIG. 15 is a diagram illustrating one example of the second operation of the main electrostatic destruction protection circuit of the semiconductor device according to the second embodiment.
Figure 15:
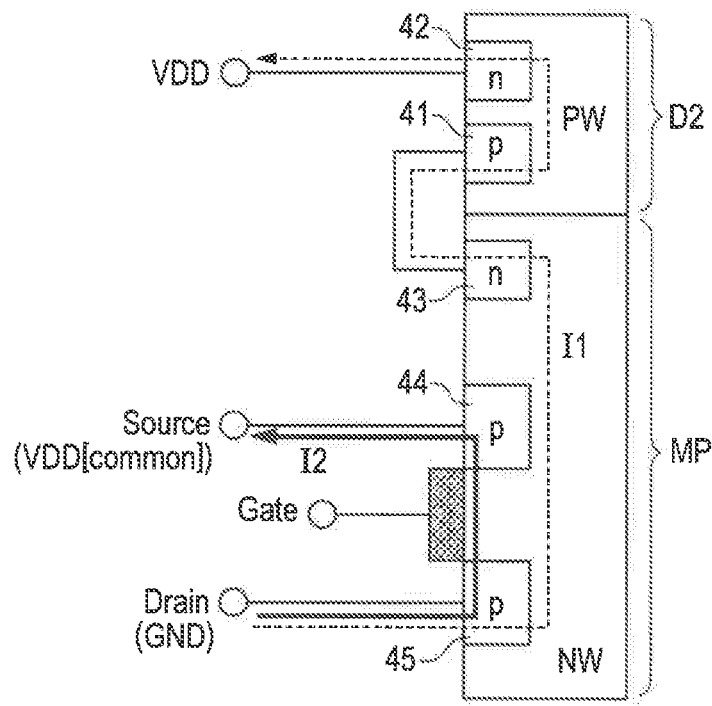

Then, FIG. 15 is a diagram illustrating one example of the second operation of the main electrostatic destruction protection circuit 10c of the semiconductor device according to the second embodiment. The second operation is the operation performed in a case where the positive surge is applied to the grounding terminal GND by using the power source terminal VDD as the common terminal. Incidentally, also in a case where the negative surge is applied to the power source terminal VDD by using the grounding terminal GND as the common terminal, the discharge path which is the same as the discharge path formed in the second operation illustrated in FIG. 15 is formed.

Incidentally, also in FIG. 15, an upper drawing illustrates one example of the discharge path with the PMOS protection transistor MP being illustrated as the transistor symbol and a lower drawing illustrates one example of the discharge path which is viewed in the direction of the cross-sectional structures of the PMOS protection transistor MP and the diode D2.

As illustrated in FIG. 15, in the second operation, a parasitic bipolar transistor which uses the back gate of the PMOS protection transistor MP as its base, uses the source thereof as its collector and uses the drain thereof as its emitter is formed. Then, when the surge is applied, the base current (the current I1 in FIG. 15) of the parasitic bipolar transistor of the PMOS protection transistor MP is drawn out via the diode D2. Thereby, the parasitic bipolar transistor of the PMOS protection transistor MP is operated. Accordingly, in the second operation, the surge current (I2 in FIG. 15) is discharged from the grounding terminal GND toward the power source terminal VDD owing to the operation of the parasitic bipolar transistor.

As described by using FIG. 15, in the semiconductor device according to the second embodiment, also in a case where the surge is applied to the grounding terminal GND by using the power source terminal VDD as the common terminal in a state where the PMOS protection transistor MP is not operated as the MOS transistor, most of the surge current is discharged via the PMOS protection transistor MP. Thereby, in the main electrostatic destruction protection circuit 10c of the semiconductor device according to the second embodiment, it is possible to reduce the current capacity requested to the diode D2. That is, in the semiconductor device according to the second embodiment, it is possible to miniaturize the diode D2. Thus, examples of a layout of the PMOS protection transistor MP and the diode D2 in the semiconductor device according to the second embodiment will be described in the following.

Figure 16:
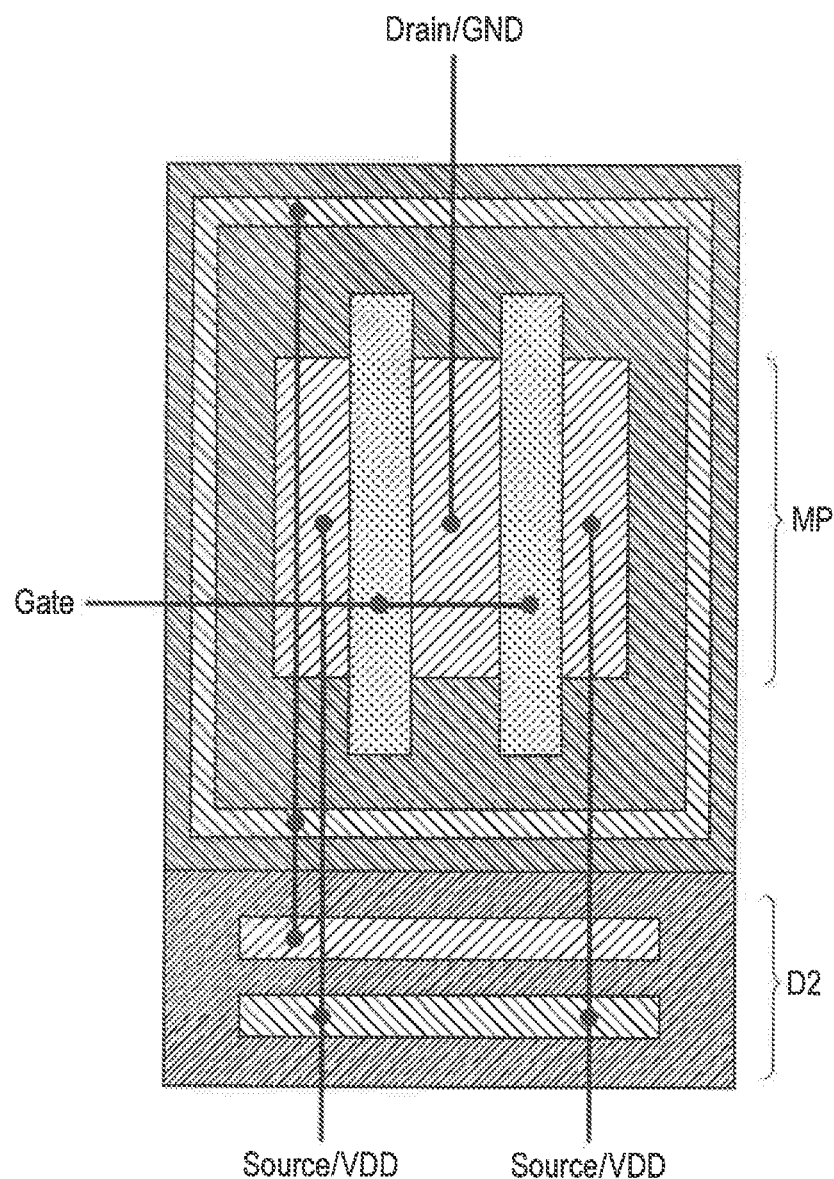
FIG. 16 is a diagram illustrating a first example of a layout of the main electrostatic destruction protection circuit of the semiconductor device according to the second embodiment.
Figure 16:

FIG. 16 is a diagram illustrating a first example of the layout of the main electrostatic destruction protection circuit (the PMOS protection transistor MP and the diode D2) of the semiconductor device according to the second embodiment. As illustrated in FIG. 16, in the PMOS protection transistor MP of the semiconductor device according to the second embodiment, the plurality of polysilicon elements which serve as the gate terminals are arranged in an upper layer of the N-type well region. In addition, the P-type diffusion region is formed in the state of striding over the polysilicon elements. The P-type diffusion region serves as the source and then as the drain of the PMOS protection transistor PM in turn. In addition, the N-type diffusion region which serves as the contact region to the back gate of the PMOS protection transistor MP is formed to surround the respective regions which serve as the gate, the source and the drain of the PMOS protection transistor MP.

In the diode D2, the P-type diffusion region which serves as the anode terminal of the diode D2 and the N-type diffusion region which serves as the cathode terminal thereof are formed in the surface layer of the P-type well region.

Basic configurations of the PMOS protection transistor MP and the diode D2 which are described above are common among a second example to a fourth example of the layout of the PMOS protection transistor MP and the diode D2 of the semiconductor device according to the second embodiment which will be described later.

Then, in the first example of the layout illustrated in FIG. 16, the diode D2 is formed in one of regions which are arranged adjacent to the PMOS protection transistor MP.

Figure 17:
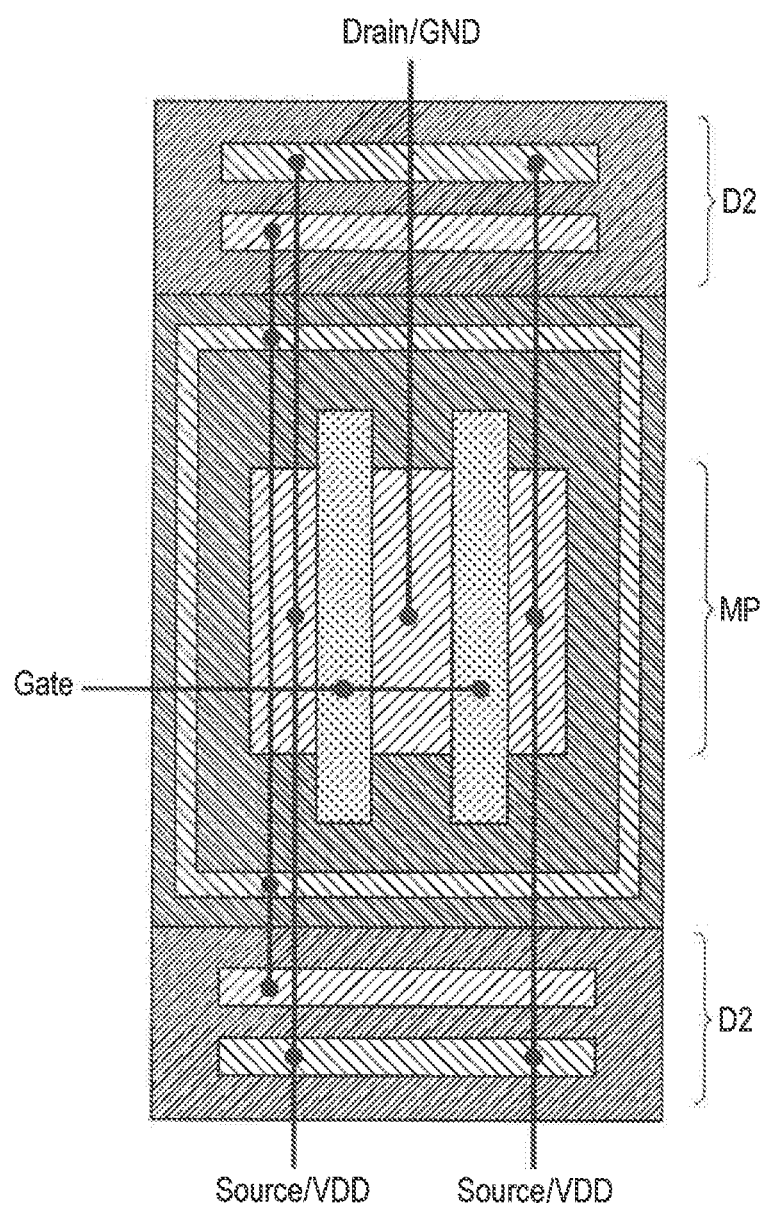
FIG. 17 is a diagram illustrating a second example of the layout of the main electrostatic destruction protection circuit of the semiconductor device according to the second embodiment.
Figure 18:
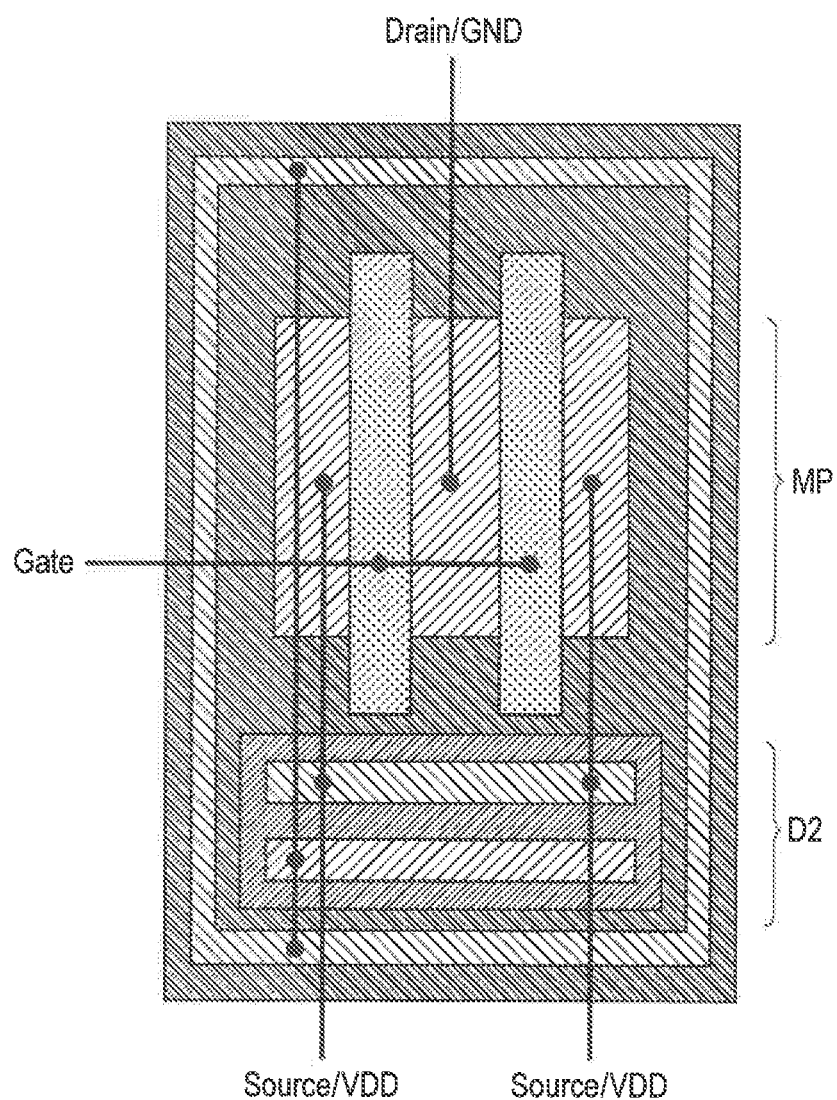
FIG. 18 is a diagram illustrating a third example of the layout of the main electrostatic destruction protection circuit of the semiconductor device according to the second embodiment.
Figure 18:
Figure 19:
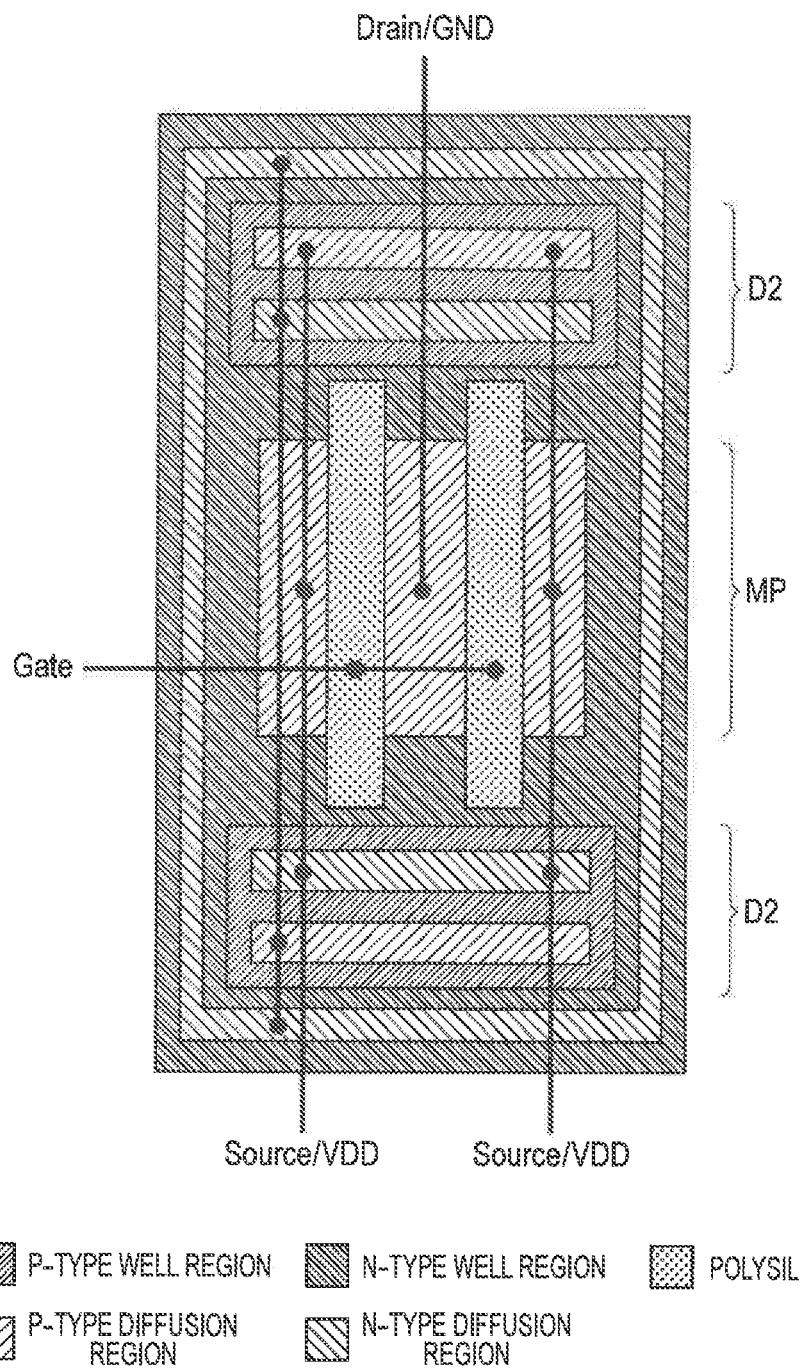
FIG. 19 is a diagram illustrating a fourth example of the layout of the main electrostatic destruction protection circuit of the semiconductor device according to the second embodiment.

Then, FIG. 17 to FIG. 19 are diagrams illustrating the second example to the fourth example of the layout of the main electrostatic destruction protection circuit of the semiconductor device according to the second embodiment respectively. In the second example illustrated in FIG. 17, the diode D2 is formed in a state of being divided into parts between which a region in which the PMOS protection transistor MP is formed is sandwiched. In the third example illustrated in FIG. 18, the diode D2 is formed in part of a region arranged on the inner side of the N-type diffusion region which serves as a contact region of the PMOS protection transistor MP. In the fourth example illustrated in FIG. 19, the diode D2 is formed in a state of being divided into a plurality of regions (two regions in the example in FIG. 19) which are arranged on the inner side of the N-type diffusion region which serves as the contact region of the PMOS protection transistor MP.

As described above, also in the semiconductor device according to the second embodiment, even in a case where the electrostatic destruction protection transistor of the semiconductor device 1 according to the first embodiment is formed by the PMOS transistor, it is possible to reduce the current capacity requested to the diode D2 and thereby it is possible to reduce the layout area of the diode D2 similarly to the first embodiment.

In addition, it is possible to increase the number of the input/output interface circuits which are allowed to be arrayed on one side of the semiconductor chip by reducing the layout area of the main electrostatic destruction protection circuit 10c. Alternatively, it is also possible to shorten the length of one side of the semiconductor chip and to reduce the chip area while arranging the necessary number of the input/output interface circuits by reducing the layout area of the main electrostatic destruction protection circuit 10c.

Incidentally, a modified example of the main electrostatic destruction protection circuit 10c of the semiconductor device according to the second embodiment is conceivable. Therefore, FIG. 20 is a circuit diagram illustrating another example (for example, a main electrostatic destruction protection circuit 10d) of the main electrostatic destruction protection circuit 10c of the semiconductor device according to the second embodiment.

Figure 20:
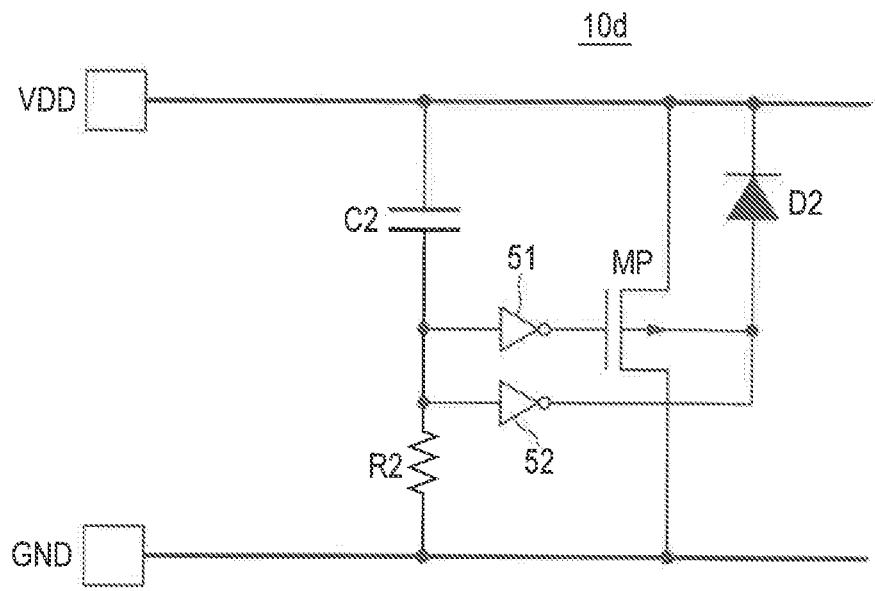
FIG. 20 is a circuit diagram illustrating another example of the main electrostatic destruction protection circuit of the semiconductor device according to the second embodiment.

As illustrated in FIG. 20, in the main electrostatic destruction protection circuit 10d, one end of the capacitor C2 is coupled to the first terminal (for example, the power source terminal VDD). In addition, the resistor R2 is coupled to the second terminal (for example, the grounding terminal GND) at one end and is coupled to the other end of the capacitor C2 at the other end. Then, a first inverter (for example, an inverter 51) is arranged between wiring which couples together the capacitor C2 and the resistor R2 and the gate of the PMOS protection transistor MP. An input terminal of the inverter 51 is coupled to the wiring which couples together the capacitor C2 and the resistor R2 and an output terminal of the inverter 51 is coupled to the gate of the PMOS protection transistor MP. In addition, a second inverter (for example, an inverter 52) is arranged between the wiring which couples together the capacitor C2 and the resistor R2 and the back gate of the PMOS protection transistor MP. An input terminal of the inverter 52 is coupled to the wiring which couples together the capacitor C2 and the resistor R2 and an output terminal of the inverter 52 is coupled to the back gate of the PMOS protection transistor MP.

In a case where the size of the diode D2 is small, it is possible to sufficiently reduce the layout area irrespective of inclusion of other circuits between the RC trigger circuit and the gate or the back gate of the PMOS protection transistor MP as in the main electrostatic destruction protection circuit 10d.

Third Embodiment

In the third embodiment, an electrostatic destruction protection circuit of the type applied to an output interface circuit will be described. Therefore, FIG. 21 is a circuit diagram illustrating one example of the electrostatic destruction protection circuit of a semiconductor device according to the third embodiment.

Figure 21:
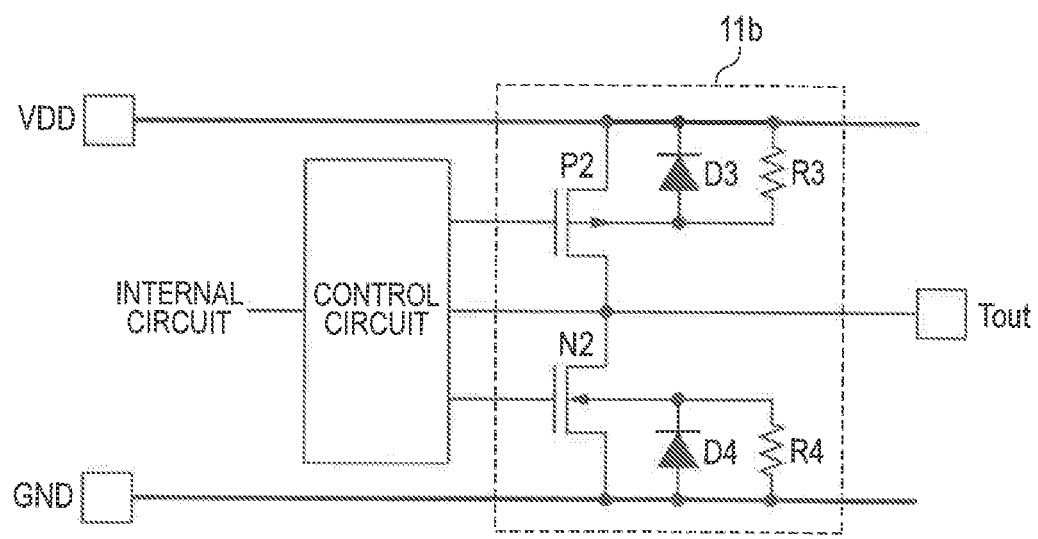
FIG. 21 is a circuit diagram illustrating one example of an electrostatic destruction protection circuit of a semiconductor device according to a third embodiment.

As illustrated in FIG. 21, an output interface circuit 11b includes a P-type output MOS transistor (for example, a PMOS transistor P2) and an N-type output MOS transistor (for example, an NMOS transistor N2) which are coupled in series with each other between the power source terminal VDD and the grounding terminal GND. Push-pull control is performed on the PMOS transistor P2 and the NMOS transistor N2 by a control circuit arranged in an internal circuit region.

The PMOS transistor P2 and the NMOS transistor N2 serve as an output buffer circuit and are formed to have transistor sizes which are larger than those of the transistors of the input buffer circuit illustrated in FIG. 2 for the purpose of achieving a predetermined current driving capability.

Accordingly, in the output interface circuit 11b according to the third embodiment, the PMOS transistor P2 and the NMOS transistor N2 are operated to function as the electrostatic destruction protection transistor when the surge is applied. In addition, in the output interface circuit 11b according to the third embodiment, diodes D3 and D4 are arranged similarly to those in the first and second embodiments for the purpose of using the PMOS transistor P2 and the NMOS transistor N2 as the discharge path for the surge current irrespective of the polarity of the surge current.

The diode D3 is arranged between a back gate and a source of the PMOS transistor P2 in such a manner that its polarity occurring in the coupling direction is reversed to a polarity of a parasitic diode which is formed between the back gate and the source of the PMOS transistor P2. Specifically, an anode of the diode D3 is coupled to the back gate of the PMOS transistor P2 and a cathode of the diode D3 is coupled to the power source terminal VDD. In addition, a resistor R3 is coupled in parallel with the diode D3.

The diode D4 is arranged between a back gate and a source of the NMOS transistor N2 in such a manner that its polarity occurring in the coupling direction is reversed to a polarity of a parasitic diode which is formed between the back gate and the source of the NMOS transistor N2. Specifically, an anode of the diode D4 is coupled to the grounding terminal GND and a cathode of the diode D4 is coupled to the back gate of the NMOS transistor N2. In addition, a resistor R4 is coupled in parallel with the diode D4.

The surge current which is applied to an output terminal Tout is discharged as follows by configuring the output interface circuit 11b as described above. The current which flows between the power source terminal VDD and the output terminal Tout is discharged through a path formed by replacing the grounding terminal GND illustrated in FIG. 14 and FIG. 15 pertaining to the second embodiment with the output terminal Tout. In addition, the current which flows between the grounding terminal GND and the output terminal Tout is discharged through a path formed by replacing the power source terminal VDD illustrated in FIG. 4 and FIG. 5 pertaining to the first embodiment with the output terminal Tout.

As described above, in the output interface circuit 11b according to the third embodiment, the transistors which configure the output buffer circuit are also utilized as the electrostatic destruction protection transistors and the diode is arranged between the back gate and the source of each transistor. Thereby, in the output interface circuit 11b according to the third embodiment, it is not necessary to provide a large-sized electrostatic destruction protection element (for example, the diode) for the purposes of discharging the surge current and thereby it is possible to reduce the circuit area.

In the foregoing, the present invention which has been made by the inventors concerned has been specifically described on the basis of the embodiments. However, it goes without saying that the present invention is not limited to the embodiments which have already been described and various modifications are possible within a range not deviating from the gist of the present invention.

What is claimed is:

1. A semiconductor device, comprising:
   first and second terminals which serve as external terminals of a semiconductor chip;
   an electrostatic destruction protection transistor whose source is coupled to the first terminal and whose drain is coupled to the second terminal;
   a diode which is coupled between a back gate of the electrostatic destruction protection transistor and the first terminal; and
   an RC circuit coupled to the first and second terminals, the RC circuit comprising a resistor and a capacitor,
   wherein one of the resistor and the capacitor is located between a gate of the electrostatic destruction protection transistor and a first wiring that couples the diode to the first terminal, and another one of the resistor and the capacitor is located between the gate of the electrostatic destruction protection transistor and a second wiring that couples the back gate of the electrostatic destruction protection transistor to the second terminal, and
   wherein the diode is arranged such that a polarity thereof which occurs in a coupling direction is reversed to a polarity of a parasitic diode which is formed between the back gate and the source of the electrostatic destruction protection transistor.

2. The semiconductor device according to claim 1,
   wherein the resistor is coupled to the first terminal at one end and is coupled to the gate and the back gate of the electrostatic destruction protection transistor at an other end,
   wherein the capacitor is coupled to the gate of the electrostatic destruction protection transistor at one end and is coupled to the second terminal at an other end, and
   wherein the resistor is coupled in parallel with the diode.

3. The semiconductor device according to claim 1,
   wherein the capacitor is coupled to the first terminal at one end,
   wherein the resistor is coupled to the second terminal at one end and is coupled to an other end of the capacitor at an other end,
   the semiconductor device further comprising:
      a first inverter whose input terminal is coupled to a third wiring which couples together the capacitor and the resistor and whose output terminal is coupled to the gate of the electrostatic destruction protection transistor; and
      a second inverter whose input terminal is coupled to the third wiring which couples together the capacitor and the resistor and whose output terminal is coupled to the back gate of the electrostatic destruction protection transistor.

4. The semiconductor device according to claim 1, wherein the electrostatic destruction protection transistor comprises an N-type MOS transistor,
   wherein the first terminal comprises a grounding terminal, and
   wherein the second terminal comprises a power source terminal.

5. The semiconductor device according to claim 1, wherein the electrostatic destruction protection transistor comprises a P-type MOS transistor,
   wherein the first terminal comprises a power source terminal, and
   wherein the second terminal comprises a grounding terminal.

6. The semiconductor device according to claim 1, wherein the electrostatic destruction protection transistor comprises an N-type output MOS transistor,
   wherein the first terminal comprises a grounding terminal, and
   wherein the second terminal comprises an output terminal,
   the semiconductor device further comprising:
      a resistor which is coupled in parallel with the diode.

7. The semiconductor device according to claim 1, wherein the electrostatic destruction protection transistor comprises a P-type output MOS transistor,
   wherein the first terminal comprises a power source terminal, and wherein the second terminal comprises an output terminal, the semiconductor device further comprising:

a resistor which is coupled in parallel with the diode.

8. The semiconductor device according to claim 1, wherein opposing ends of the RC circuit are directly connected to the first and second terminals, respectively.

9. The semiconductor device according to claim 8, wherein the electrostatic destruction protection transistor is directly connected to the first and second terminals.

10. The semiconductor device according to claim 9, wherein the source of the electrostatic destruction protection transistor is directly connected to the first terminal.

11. The semiconductor device according to claim 10, wherein the second wiring directly connects the drain of the electrostatic destruction protection transistor to the second terminal.

12. The semiconductor device according to claim 11, wherein the resistor and the capacitor are disposed on opposing sides of a node that connects the gate of the electrostatic destruction protection transistor to the RC circuit.

13. The semiconductor device according to claim 12, wherein the node is placed adjacent to the gate of the electrostatic destruction protection transistor and between the resistor and the capacitor.

14. The semiconductor device according to claim 1, wherein the electrostatic destruction protection transistor is directly connected to the first and second terminals.

15. The semiconductor device according to claim 1, wherein the source of the electrostatic destruction protection transistor is directly connected to the first terminal.

16. The semiconductor device according to claim 1, wherein the second wiring directly connects the drain of the electrostatic destruction protection transistor to the second terminal.

17. The semiconductor device according to claim 1, wherein the resistor and the capacitor are disposed on opposing sides of a node that connects the gate of the electrostatic destruction protection transistor to the RC circuit.

18. The semiconductor device according to claim 17, wherein the node is placed adjacent to the gate of the electrostatic destruction protection transistor and between the resistor and the capacitor.

19. A semiconductor device, comprising:

first and second terminals;

an electrostatic destruction protection transistor coupled to the first and second terminals;

a diode which is coupled between a back gate of the electrostatic destruction protection transistor and the first terminal; and an RC circuit coupled to the first and second terminals, the RC circuit comprising a resistor and a capacitor, wherein one of the resistor and the capacitor is located between a gate of the electrostatic destruction protection transistor and a first wiring that couples the diode to the first terminal, and another one of the resistor and the capacitor is located between the gate of the electrostatic destruction protection transistor and a second wiring that couples the back gate of the electrostatic destruction protection transistor to the second terminal.

20. The semiconductor device according to claim 19, wherein a polarity of the diode which occurs in a coupling direction is reversed to a polarity of a parasitic diode which is formed between the back gate and the source of the electrostatic destruction protection transistor.

* * * * *